United States Patent
Biesterfeldt et al.

(10) Patent No.: US 7,521,975 B2
(45) Date of Patent: Apr. 21, 2009

(54) OUTPUT BUFFER WITH SLEW RATE CONTROL UTILIZING AN INVERSE PROCESS DEPENDENT CURRENT REFERENCE

(75) Inventors: Randall Paul Biesterfeldt, Austin, TX (US); Bryan Timothy Heenan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 451 days.

(21) Appl. No.: 11/038,909

(22) Filed: Jan. 20, 2005

(65) Prior Publication Data

US 2006/0190880 A1    Aug. 24, 2006

(51) Int. Cl.
    *H03K 5/12*    (2006.01)
(52) U.S. Cl. ........................ 327/170; 327/108
(58) Field of Classification Search ...................... 710/52
    See application file for complete search history.

(56) References Cited

U.S. PATENT DOCUMENTS

| | | | |
|---|---|---|---|
| 5,510,729 A | | 4/1996 | Reymond |
| 5,633,603 A | | 5/1997 | Lee |
| 5,877,647 A | * | 3/1999 | Vajapey et al. ............... 327/391 |
| 5,973,512 A | | 10/1999 | Baker |
| 6,084,431 A | * | 7/2000 | Shigehara et al. ............. 326/81 |
| 6,243,426 B1 | | 6/2001 | Lo et al. |
| 6,445,170 B1 | * | 9/2002 | Pangal et al. ................. 323/315 |
| 6,545,503 B1 | * | 4/2003 | Tomasini et al. .............. 326/27 |
| 6,690,192 B1 | | 2/2004 | Wing |
| 6,756,813 B2 | | 6/2004 | Harada |
| 6,903,588 B2 | * | 6/2005 | Vorenkamp ................. 327/170 |
| 7,019,551 B1 | | 3/2006 | Biesterfeldt |
| 7,154,309 B1 | | 12/2006 | Talbot et al. |
| 2002/0176285 A1 | * | 11/2002 | Hunt ..................... 365/189.05 |

FOREIGN PATENT DOCUMENTS

| | | | |
|---|---|---|---|
| EP | 0678983 A1 | | 10/1995 |
| EP | 0765037 A2 | | 3/1997 |
| EP | 0765037 A3 | | 3/1997 |
| EP | 1237279 A1 | | 4/2002 |
| EP | 1246366 A2 | * | 10/2002 |
| EP | 1246366 A3 | * | 10/2002 |

OTHER PUBLICATIONS

Examination Report mailed Jul. 4, 2008 for UK Patent Application No. 0713747.4, 3 pages.

* cited by examiner

*Primary Examiner*—Tuan T Lam
(74) *Attorney, Agent, or Firm*—Zagorin O'Brien Graham LLP

(57) ABSTRACT

An output driver circuit provides more constant slew rates in the presence of process, voltage, or temperature variations that affect performance. An open ended (no feedback) solution is utilized that provides more constant slew rates in spite of PVT variations. A first performance dependent current and a reference current are generated and a third current is generated that is inversely related to performance utilizing the reference current and the performance dependent current. The third current is supplied to a gate of a first transistor circuit forming a portion of the output driver to thereby control the slew rate.

22 Claims, 5 Drawing Sheets

OUTPUT BUFFER WITH SLEW RATE CONTROL UTILIZING AN INVERSE PROCESS DEPENDENT CURRENT REFERENCE

CROSS-REFERENCE TO RELATED APPLICATION(S)

BACKGROUND

1. Field of the Invention

This invention relates to output buffers utilized in integrated circuits and more particularly to controlling slew rates of such output buffers.

2. Description of the Related Art

High speed data busses, such as PCIX 2.0, have requirements regarding variations in slew rate. Slew rate in that context is the rate of change of output signal voltage. For example in PCIX 2.0, the slew rate requirement is 1.8V/ns<Slew Rate<3.0 V/ns. One approach to providing slew rate control is to build a replica circuit of an output buffer that accurately represents the output slew rate. A slew rate control current is then adjusted until the replica slew rate measures to be within limits. Adjusting the replica circuit appropriately requires an external time base and a slew rate measurement technique.

In integrated circuit manufacturing, the manufacturing process varies resulting in integrated circuits having different performance capabilities, even if the same part is manufactured in the same manufacturing facility. Thus, due to process variations and operating ranges, integrated circuits behave differently. As a result integrated circuits may be grouped based on performance into "fast corners" and "slow corners." In the fast corner, integrated circuits perform faster due to variations of such factors as process, voltage, or temperature. Process variations can include such factors as threshold voltage ($V_T$), gate length, input capacitance, sheet resistance, and gate to drain capacitance. Integrated circuits that operate in the fast corner typically have process characteristics leading to faster performance such as lower $V_T$, shorter gate length, lower input capacitance, etc. Similarly, a high supply voltage $V_{DD}$ can result in increased performance of the integrated circuit. For those integrated circuits in the slow corner, their operation is slower due to such factors as low $V_{DD}$ and high $V_T$. Of particular interest herein is the varying performance of output driver circuits due to process, voltage, and/or temperature (PVT) variations.

Performance variations due to process, voltage, and temperature make it difficult to guarantee that slew rate requirements are met across normal process variations. That is, an output signal will change too quickly or too slowly to meet slew rate requirements.

SUMMARY

Accordingly, it would be desirable to provide an output driver circuit that provides more constant slew rates in the presence of process, voltage, and/or temperature (PVT) variations that affect performance. An open ended (no feedback) solution is utilized that provides more constant slew rates in spite of PVT variations. In one embodiment, that solution provides a method of reducing variation in slew rate of an output driver of an integrated circuit. The method includes generating a first performance dependent current; generating a reference current; generating a third current inversely related to performance utilizing the reference current and the performance dependent current; and supplying the third current to a gate of a first transistor circuit forming a portion of the output driver to thereby control the slew rate in the presence of PVT variations.

In another embodiment, an integrated circuit is provided that has an output circuit that includes a first transistor coupling an output terminal of the integrated circuit to a first power supply node when data to be output by the output circuit is at a first value. The first transistor is coupled to receive a gate current inversely related to performance of the output circuit. Thus, the slew rate remains more constant, even across performance variations due to PVT variations.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
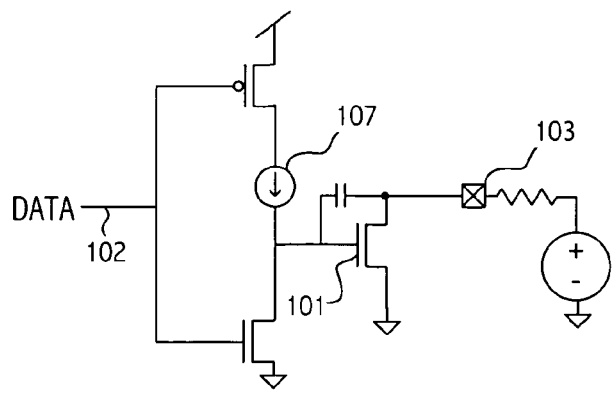
FIG. 1 illustrates a pull down portion of an output stage of an integrated circuit.

Referring to FIG. 1 illustrated is a pull down portion of an output stage of an integrated circuit. Transistor 101, when turned on as a result of DATA supplied on node 102 being 0, pulls down the pad 103 to a low level. With an ideally constant gate current from current source 107, there is a considerable (more than 2:1) variation in output slew rate over process, voltage, and temperature (PVT). If the gate current instead has an inverse relationship to PVT, that is the gate current decreases as performance increases due to variation in PVT, that gate current would more closely match the gate current required for a more constant or substantially constant output slew rate across variations in process, voltage and/or temperature.

Figure 2:
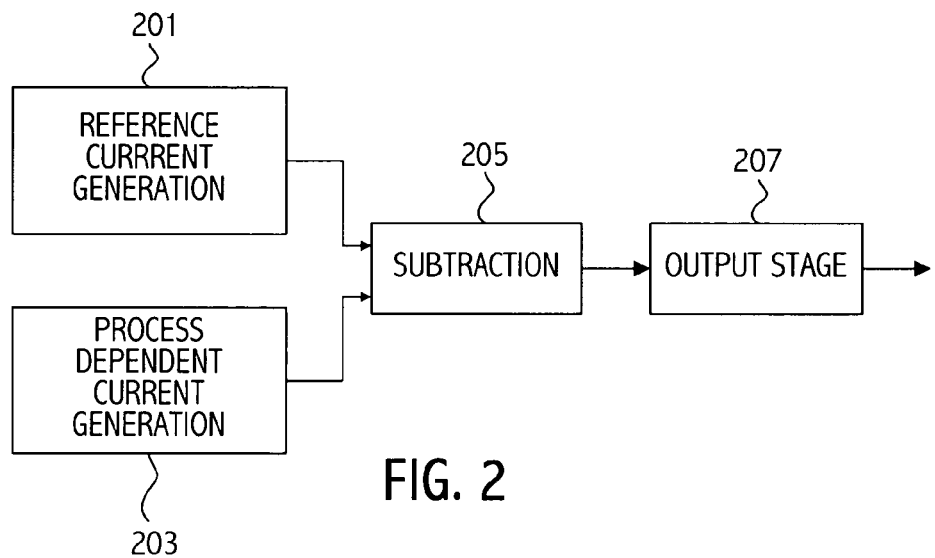
FIG. 2 is a high level block diagram, which illustrates an embodiment that provides a gate current that is inversely proportional to performance variations due to process, voltage, and temperature.

Referring to FIG. 2, a high level block diagram illustrates an embodiment that provides a gate current that is inversely related to performance variations due to process, voltage, and temperature. That is, as performance increases, the current decreases and vice versa. In the embodiment illustrated in FIG. 2, a reference current is developed in reference current generation circuit 201 and a process dependent current is developed in the process dependent current generation circuit 203. The process dependent current is then subtracted from the reference current in subtraction circuit 205. The resulting current is provided as a gate current for a transistor in the output driver stage 207.

Figure 3:
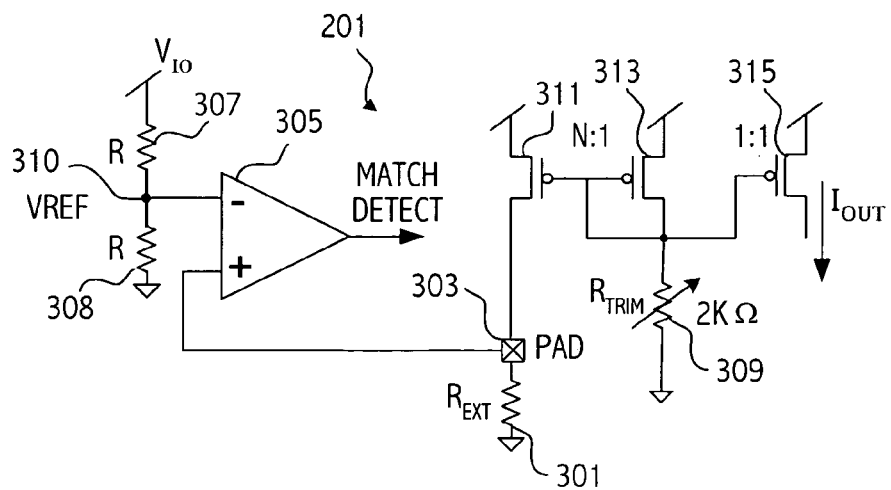
FIG. 3 shows an embodiment of the reference current generation circuit shown in FIG. 2.

FIG. 3 shows an embodiment of reference current generation circuit 201. An external resistor $R_{EXT}$ 301 is coupled to an output terminal of the integrated circuit at pad 303. Because the resistor is external a high precision resistor, e.g., having a precision of better than 1%, may be used. The voltage present on the pad 303 is compared to a voltage VREF 310 supplied to comparator 305 from the voltage divider formed by resistors 307 and 308. The current through variable resistor ($R_{TRIM}$) 309 is mirrored through transistors 311 and 315. The reference current $I_{OUT}$ is used as the output of reference current generation circuit 201.

In operation, the voltage at pad 303 is changed by varying resistor 309 until the comparator 305 detects a match between the voltage at pad 303 and the voltage supplied to the comparator from the voltage divider. When a match occurs, a known voltage at pad 303 determined by $V_{IO}$ and the resistors 307 and 308 and a known resistance at $R_{EXT}$ 301 determine a current that is mirrored internally to form the reference current $I_{OUT}$.

In one embodiment, illustrated in FIG. 3, the resistor 301 $R_{EXT}$=114Ω, N=37 (where N is the ratio of the transistor sizes), the resistor 309 $R_{TRIM}$=N×$R_{EXT}$ and $I_{OUT}$ through transistor 315 is:

$$I_{OUT} = \frac{V_{IO}}{2} \times \frac{1}{R_{EXT}} \times \frac{1}{N} = \frac{V_{IO}}{4000}$$

Note that if the voltage $V_{IO}$ has an unacceptably large variation, a more stable voltage supply may be utilized. Other errors in the output current $I_{OUT}$ may be introduced due to an imperfect N ratio match in transistors 311, 313, and 315. A low differential amplifier gain in comparator 305 may also introduce some error.

Figure 4:
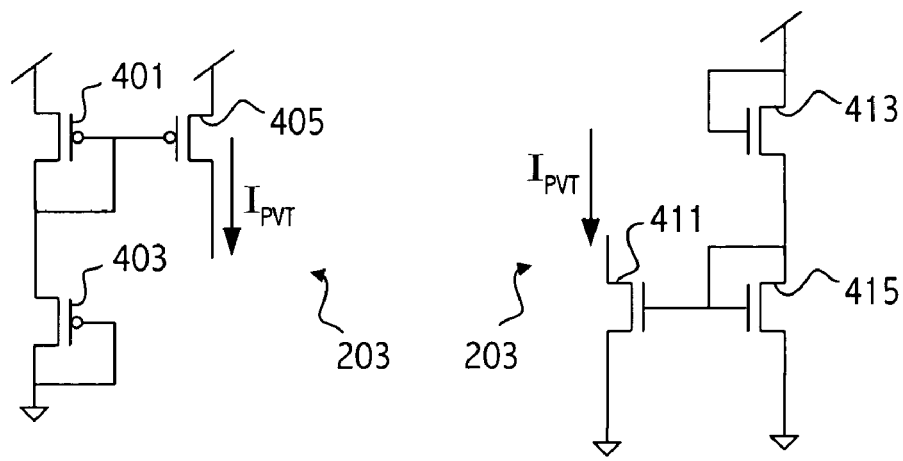
FIG. 4 illustrates embodiments of the process dependent current generation circuit shown in FIG. 2.

Referring now to FIG. 4, embodiments of process dependent current generation circuit 203 is illustrated. The embodiments in FIG. 4 illustrate developing process dependent current that is proportional to performance using PMOS transistors 401, 403, and 405 and using NMOS transistors 411, 413, and 415. The current proportional to performance, shown as $I_{PVT}$, is then used by subtraction circuit 205 (see FIG. 2) in obtaining a gate current utilized to drive a transistor in the output stage 207. Two subtraction circuits may be utilized to supply current to the pull-up and pull-down portion of the output driver circuit. The process dependent current is subtracted from the reference current and the resulting current functions as a current reference driving the output transistor coupling the output terminal to either the high or low power supply voltage in the output stage.

For those integrated circuits operating in the fast corner, the process dependent current supplied by the circuits shown in FIG. 4 is higher as compared to those integrated circuits operating in the slow corner, where the process dependent current is lower. Without the teachings herein, those integrated circuits operating in the fast corner and those in the slow corner could have unacceptably different slew rates.

Figures 5A, 5B:
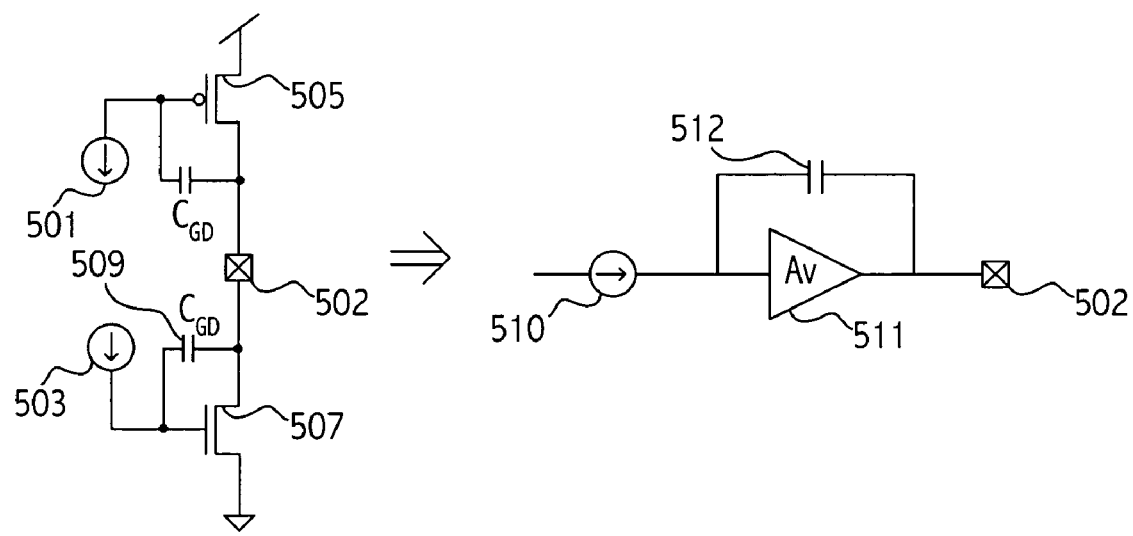
FIG. 5A is a simplified diagram illustrating an embodiment of an output buffer circuit that utilizes the slew rate control contemplated herein.
FIG. 5B shows another representation of the integrator formed by the circuit shown in FIG. 5A.

FIG. 5A is a simplified diagram illustrating an output buffer circuit that utilizes the slew rate control contemplated herein. Current references 501 and 503 supply current to the gates of transistors 505 and 507, respectively, which pull the pad 502 up or down according to the control signals supplied to the gates of the transistors 505 and 507. Other portions of the output driver, such as the additional details shown in FIG. 1, are omitted for the sake of simplicity. The pull down portion of the output driver that includes current reference 503 that supplies current (generated in a manner described in relation to FIG. 2) to the gate of transistors 507. An integrator is formed in the output stage that includes the transistor 507 and the gate to drain capacitance $C_{gd}$ 509 associated with the transistor 507. The pull-up portion of the output buffer operates in a similar manner.

The integrator formed by the circuit shown in FIG. 5A may also be represented as shown in FIG. 5B. The integrator includes a current source 510 supplying an amplifier 511 having a gain of Av, and a capacitor 512. The current source 510 represents the current source 501 or 503 and the capacitor 512 is the gate to drain capacitance associated with transistors 505 or 507. The integrator in FIG. 5 is represented by the following equation:

$$v = \int_a^b I \, dt + C,$$

where C is a constant. For large Av, the slew rate prior to the input reaching the amplifier's threshold at the gate is:

$$\frac{dv}{dt} = \frac{nI_{REF}}{C_{gd}},$$

where $nI_{REF}$ is the current supplied by the current source 510. During output slew:

$$\frac{dv}{dt} = \frac{nI_{REF}}{C_{gd}(Av+1)}.$$

Figure 6:
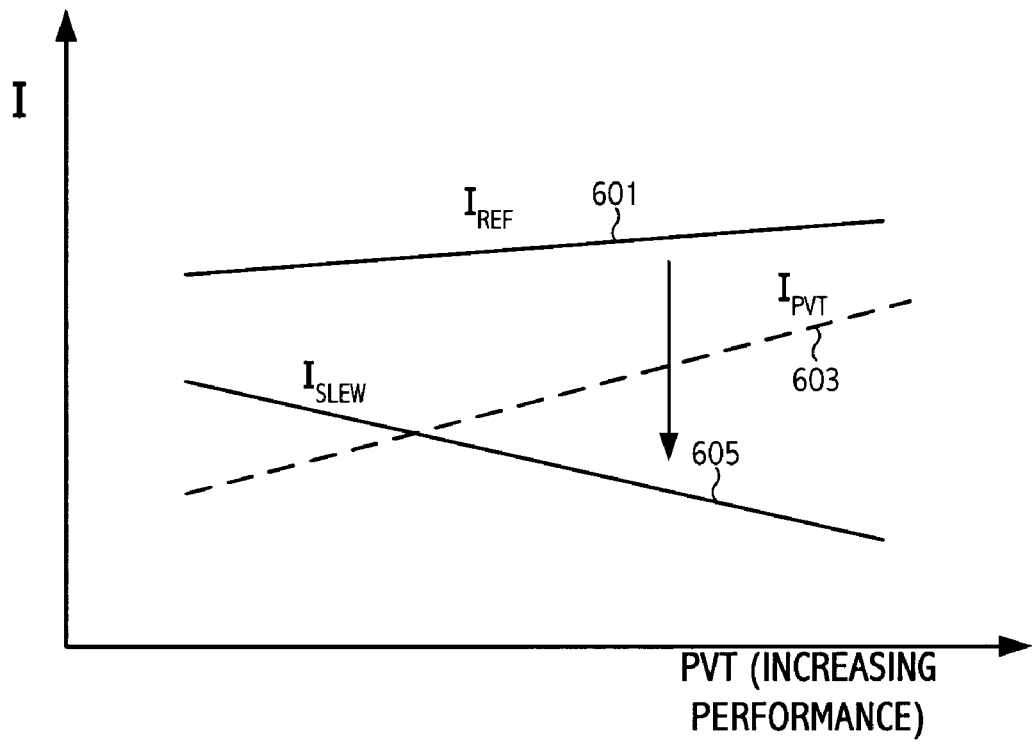
FIG. 6 illustrates operation of the subtraction circuit in FIG. 2 that supplies the current used in FIG. 5.

FIG. 6 illustrates operation of the subtraction circuit 205 in FIG. 2 that supplies the current used in FIG. 5. The reference current $I_{REF}$ 601 is supplied by the reference current generation circuit 201. That current may be substantially constant across process and voltage variations or may have some variation, as described further herein. The process dependent current $I_{PVT}$ 603 generated, e.g., by the circuits shown in FIG. 4, is subtracted from the reference current and the resulting current $I_{SLEW}$ is supplied as the gate current to, e.g., transistor 507 (See FIG. 5). Note that the gate current $I_{SLEW}$ decreases as performance increases.

Figure 7:
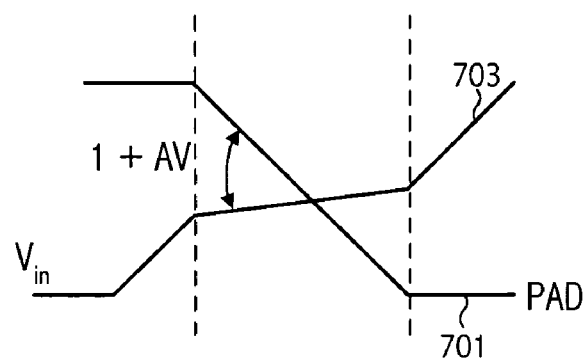
FIG. 7 illustrates how the pad voltage changes in response to a change in $V_{in}$ with a constant $I_{in}$, where $V_{in}$ is the voltage at the gate of the output transistor.

FIG. 7 illustrates how the pad voltage and $V_{in}$ changes assuming a constant $I_{in}$ (see 510 in FIG. 5) where $V_{in}$ is the voltage at the gate of the output transistor (e.g. transistor 507 in FIG. 5) that couples the pad to a supply voltage (i.e. power or ground), and Av represents the gain of the output circuit. Note that $I_{in}$ charges the input capacitance more quickly before and after the output slews.

Figure 8:
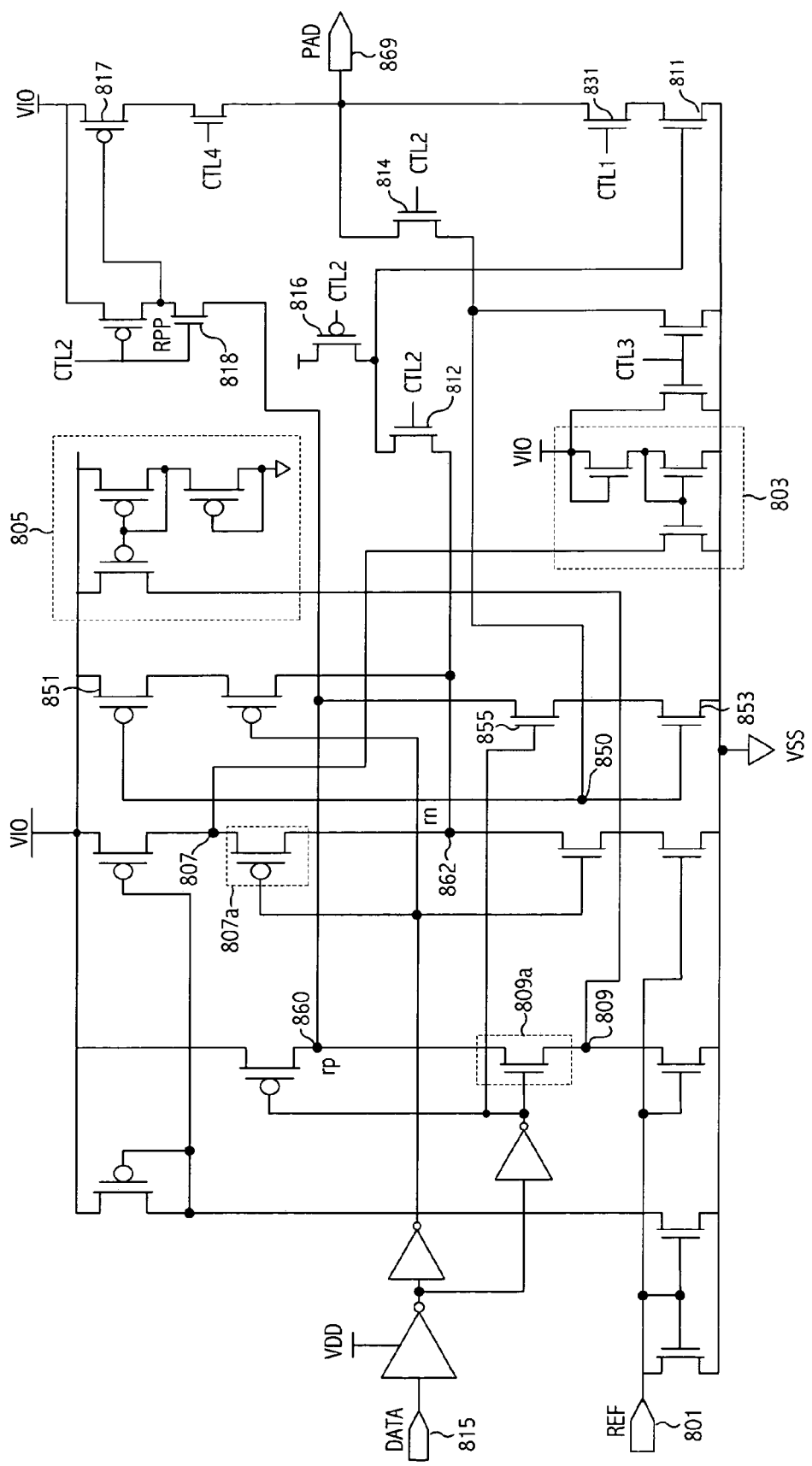
FIG. 8 illustrates an embodiment of an output buffer circuit according to an embodiment of the invention.

Referring to FIG. 8, illustrated is an embodiment of an output buffer circuit according to an embodiment of the invention. The reference current generated, e.g., as shown in FIG. 3, is supplied on node 801. The process dependent current generation circuits 803 and 805 supply the current that varies directly with performance due to, e.g., process, voltage, and temperature variations. The process dependent current generation circuits 803 and 805 supply currents to summing nodes 807 and 809 respectively, where a copy of the reference current supplied on node 801 is also supplied. The process dependent current is subtracted from the reference current at the summing nodes 807 and 809 to generate the gate current 605 ($I_{SLEW}$) shown in FIG. 6. When the input data supplied on node 815 is 0, a current is developed in branch 807a that has a value of $I_{REF}$-$I_{PVT}$ that is supplied to the gate of transistor 811 through node 862 and transistor 812. Transistor 812 functions as a pass gate that is controlled to be on when skew control is utilized. It may be turned off in certain embodiments when the output buffer is configured for operating without the skew control to provide protection when VIO is 3.3V. In skew control mode in the embodiment illustrated, VIO is approximately 1.5 V.

When the data supplied on node 815 has a value of one, a current is developed at branch 809a that has a value of $I_{REF}$-$I_{PVT}$ that is supplied to the gate of pull-up transistor 817 through node 860 and pass transistor 818, which is configured similarly to pass transistor 812. Transistor 814 provides feedback to complete pre-drive swing.

While not necessary to understanding the invention, the control inputs CTL1, CTL2, CTL3, and CTL4 can be configured to allow operation in 3.3 volt mode in conjunction with other circuitry (not shown) in which skew control is not utilized. That allows the same output driver to be used for different modes of operation to limit the output capacitance in a particular embodiment of the invention. In 3.3 volt operation, skew control is not utilized so the details of providing that capability are omitted as they are unnecessary for understanding the invention. In skew control mode, with VIO approximately 1.5V, CTL1, CTL2, and CTL4 are approximately 3.3V and CTL3=0.

Note that input/output logic is often located on a different power plane, utilizing for example $V_{IO}$, as opposed to VDD, appropriate circuits may be required to interface between the two power planes, e.g., where data is received on node 815, in a manner well known in the art.

FIG. 8 also illustrates an embodiment in which an extra pull-up and pull-down circuit are provided to complete the pre-drive switch. Such circuits may be utilized to help achieve change in logic level within the time allotted, e.g., a bit time. In the illustrated embodiment, the value on the output pad 862 is fed back to node 850 which will cause either transistor 851 or 853 to turn on. Thus, as the value of the output pad reaches its target value, the pre-drive is completed more quickly. For example, if the output pad is approaching a logic 1 level, that voltage is fed back to node 850, which causes transistor 853 to start to turn on. Transistor 855 is already turned on because of the value of the data input on node 815. Thus, the node 862 is pulled down more completely in the allotted time. That helps ensure completion of the internal node swing in the allotted time to avoid inter-symbol interference (ISI).

Figure 9:
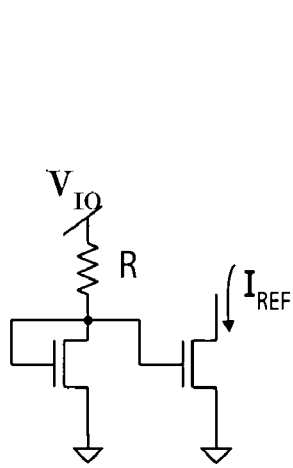
FIG. 9 illustrates another embodiment in which the reference current developed is inversely proportional to performance based on, e.g., process variations.
Figure 10:
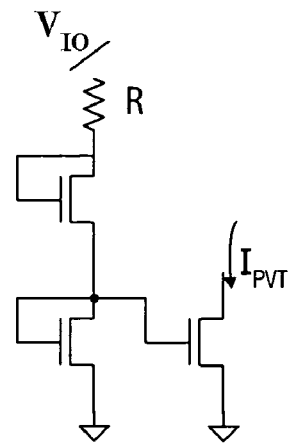
FIG. 10 illustrates development of a current that has a larger inverse process dependence than the current in FIG. 9.

Referring now to FIG. 9, in another embodiment the reference current is current directly related to performance based on, e.g. process variations. The reference current $$I_{REF} = \frac{V_{IO} - V_{gs}}{R}$$

where $V_{gs}$ is a function of process, voltage, and temperature and resistor tolerance. Referring to FIG. 10, a current $I_{PVT}$ is created that has a larger process dependence, $$I_{PVT} = \frac{V_{IO} - 2V_{gs}}{R}.$$

Figure 11:
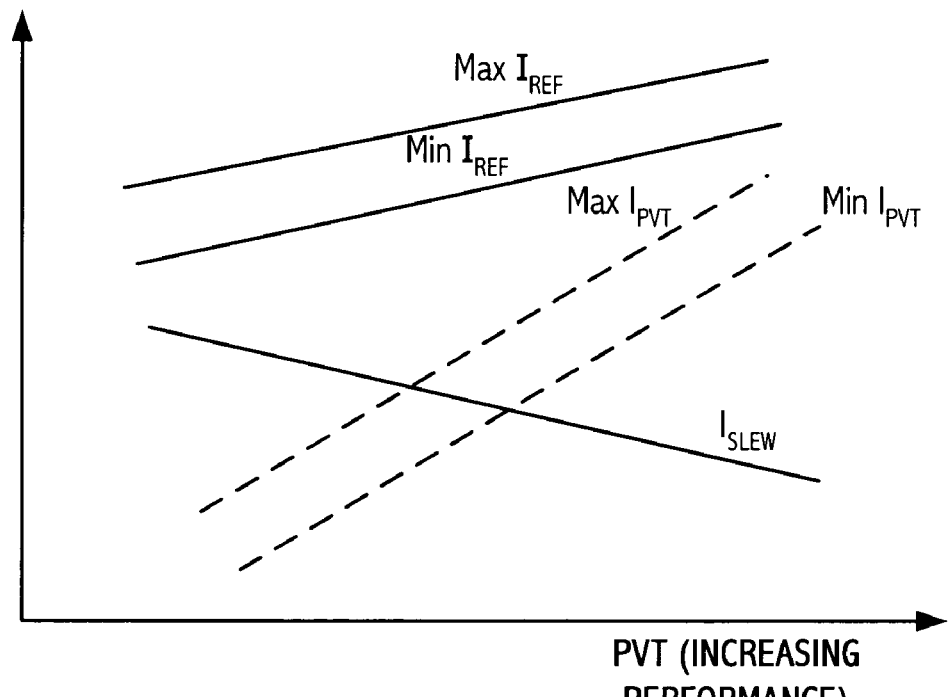
FIG. 11 illustrates operation of another embodiment of the invention utilizing current developed as shown in FIGS. 9 and 10.

Then $I_{PVT}$ is subtracted from $I_{REF}$ to generate the gate current $I_{SLEW}$ shown in FIG. 11. Note that because $I_{PVT}$ has a steeper curve than $I_{REF}$, the resultant $I_{SLEW}$ is still inversely related to performance. Note also, as shown in FIG. 11, as R varies the current $I_{PVT}$ and $I_{REF}$ also vary. Minimum and maximum curves for both $I_{REF}$ and $I_{PVT}$ based on R are shown. A single curve for $I_{REF}$ is shown, but the curve will also vary based on, which $I_{PVT}$ and $I_{REF}$ are used to develop $I_{SLEW}$.

Thus, various embodiments have been described controlling skew in an output buffer. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
reducing slew rate variations of an output of an output driver circuit of an integrated circuit by generating and supplying a first input current to a node coupled to a gate of a first transistor of the output driver circuit having a magnitude that is inversely related to integrated circuit performance;
selectively enabling a feedback circuit coupled to the node in response to at least one control signal; and
supplying additional current to the node coupled to the gate of the first transistor via the feedback circuit as the output driver circuit reaches its stable output value, its stable output value corresponding to a respective one of the first and second power supply nodes, according to a value of data supplied by the output driver circuit.

2. The method as recited in claim 1 further comprising reducing slew rate variations by supplying a second input current to a node coupled to a gate of a second transistor of the output driver circuit having a magnitude that is inversely related to the performance.

3. The method as recited in claim 2 wherein the first transistor couples the output driver circuit output to a first power supply node when data to be output by the output buffer is at a first value and the second transistor couples the output buffer output to a second power supply node when the data is at a second value.

4. The method as recited in claim 1 wherein the first input current is generated utilizing a second current that is directly related to performance and a reference current.

5. The method as recited in claim 4 wherein the reference current is inversely related to the performance.

6. The method as recited in claim 4 wherein the reference current is directly related to the performance.

7. The method as recited in claim 4 wherein the reference current is substantially constant.

8. The method as recited in claim 4 wherein the reference current is generated utilizing a variable resistor in the integrated circuit and an external reference resistor.

9. The method as recited in claim 1 wherein the integrated circuit performance is determined at least in part by process and voltage variations.

10. The method as recited in claim 1 wherein the first input current is further determined according to a value of data output by the output driver circuit.

11. An integrated circuit comprising:
an output circuit including a first transistor coupling an output terminal of the integrated circuit to a first power supply node when data to be output by the output circuit is at a first value, a gate of the first transistor being coupled to a first node configured to receive a first current inversely related to performance of the output circuit;
at least one device configured to selectively enable a feedback circuit coupled to the first node in response to at least one control signal; and
wherein the output circuit further comprises one or more additional transistors coupled to the first node, the one or more additional transistors being configured to provide an additional current to the first node after an output of the output circuit reaches a given output value.

12. The integrated circuit as recited in claim 11 wherein a variation in performance is due to at least one of process variation, voltage variation, and temperature variation.

13. The integrated circuit as recited in claim 11 wherein the output circuit further comprises a second transistor, a gate of the second transistor being coupled to a second node configured to receive a second current that is inversely related to the performance of the output circuit, the second transistor coupling the output terminal to a second power supply node when the data is at a second value.

14. The integrated circuit as recited in claim 11 further comprising:
a first current source supplying the first current inversely related to the performance of the integrated circuit;
a second current source supplying a reference current; and
wherein current through the first node is formed by combining the first current and the reference current.

15. The integrated circuit as recited in claim 14 wherein the combining is a subtraction.

16. The integrated circuit as recited in claim 14 further comprising a current mirror generating a current corresponding to the reference current that is proportional to a value of a current determined by a voltage at an output terminal of the integrated circuit and an external resistance.

17. An integrated circuit comprising:
a first transistor having a first type and a gate terminal coupled to a first node, the first transistor being configured to couple an output node of the integrated circuit to a first power supply node when data to be output by the integrated circuit is a first value;
a second transistor having a second type complementary to the first type and being coupled to the first node and having a gate terminal coupled to receive a version of the data;
a current reference circuit coupled to the second transistor and configured to develop a current through the second transistor having a magnitude that is inversely related to integrated circuit performance;
an additional circuit coupled to the first node, the additional circuit comprising:
a third transistor having the second type and being coupled to the first node, a gate terminal of the third transistor being configured to receive the version of the data signal; and
a fourth transistor having the second type and being coupled between the third transistor and a second power supply node, a gate terminal of the fourth transistor being coupled to receive feedback from the output node.

18. The integrated circuit as recited in claim 17, wherein the first type is p-type and the second type is n-type and wherein the third and fourth transistors are configured to increase the rate of discharge of the first node after the output node reaches a predetermined voltage level.

19. The integrated circuit as recited in claim 17 wherein the current reference circuit is configured to subtract a process-dependent current from a reference current to thereby generate the current through the second transistor.

20. The integrated circuit as recited in claim 17 wherein the additional circuit is selectively enabled by selectively coupling the output node to a gate terminal of the fourth transistor.

21. The integrated circuit as recited in claim 17, further comprising:
a fifth transistor having the second type and a gate terminal coupled to a second node, the fifth transistor being configured to couple the output node of the integrated circuit to the second power supply node when data to be output by the integrated circuit is a second value;
a sixth transistor having the first type and being coupled to the second node and having a gate terminal coupled to receive a second version of the data;
a second current reference circuit coupled to the sixth transistor and configured to develop a current through the sixth transistor having a magnitude that is inversely related to integrated circuit performance;
a second additional circuit coupled to the second node, the second additional circuit comprising:
a seventh transistor having the first type and being coupled to the second node, a gate terminal of the seventh transistor being configured to receive the second version of the data signal; and
an eighth transistor having the first type and being coupled between the seventh transistor and the first power supply node, a gate terminal of the eighth transistor being coupled to receive feedback from the output node.

22. The integrated circuit as recited in claim 21 wherein the first type is p-type and the second type is n-type and wherein the seventh and eighth transistors are configured to increase the rate of charging of the second node after the output node reaches a second predetermined voltage level.

* * * * *

UNITED STATES PATENT AND TRADEMARK OFFICE
CERTIFICATE OF CORRECTION

PATENT NO. : 7,521,975 B2  Page 1 of 1
APPLICATION NO. : 11/038909
DATED : April 21, 2009
INVENTOR(S) : Randall Paul Biesterfeldt et al.

It is certified that error appears in the above-identified patent and that said Letters Patent is hereby corrected as shown below:

Col. 6, line 40 (Claim 1), please replace "the first and second power supply nodes" with --a first and second power supply nodes--
line 43 (Claim 3), please replace "to a first" with --to the first--
line 46 (Claim 3), please replace "to a second" with --to the second--

Signed and Sealed this

Twentieth Day of October, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,521,975 B2 | Page 1 of 1 |
| APPLICATION NO. | : 11/038909 | |
| DATED | : April 21, 2009 | |
| INVENTOR(S) | : Randall Paul Biesterfeldt et al. | |

It is certified that error appears in the above-identified patent and that said Letters Patent is hereby corrected as shown below:

Col. 6, line 40, next to the last line of Claim 1, please replace "the first and second power supply nodes" with
--first and second power supply nodes--

Signed and Sealed this
Eighth Day of November, 2011

David J. Kappos
*Director of the United States Patent and Trademark Office*